(12) United States Patent
Fjelstad et al.

(10) Patent No.: US 8,026,600 B2
(45) Date of Patent: Sep. 27, 2011

(54) CONTROLLED IMPEDANCE STRUCTURES FOR HIGH DENSITY INTERCONNECTIONS

(75) Inventors: Joseph C. Fjelstad, Maple Valley, WA (US); Kevin P. Grundy, Fremont, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 219 days.

(21) Appl. No.: 12/348,273

(22) Filed: Jan. 2, 2009

(65) Prior Publication Data
US 2009/0167334 A1 Jul. 2, 2009

Related U.S. Application Data

(60) Provisional application No. 61/018,495, filed on Jan. 2, 2008.

(51) Int. Cl.
*H01L 23/48* (2006.01)

(52) U.S. Cl. ............................ 257/735; 438/611; 29/884
(58) Field of Classification Search .......... 257/734–736, 257/773, E21.151; 324/754; 361/306.1; 29/884; 438/611
See application file for complete search history.

(56) References Cited

U.S. PATENT DOCUMENTS

| | | | |
|---|---|---|---|
| 6,581,276 B2 * | 6/2003 | Chung ............................ 29/825 |
| 2005/0093152 A1 * | 5/2005 | Fjelstad et al. ................ 257/738 |
| 2005/0127419 A1 * | 6/2005 | Hashimoto .................... 257/296 |
| 2005/0133922 A1 * | 6/2005 | Fjelstad et al. ................ 257/758 |

* cited by examiner

*Primary Examiner* — Ha Tran T Nguyen
*Assistant Examiner* — Shaun Campbell
(74) *Attorney, Agent, or Firm* — Myers Bigel Sibley & Sajovec, P.A.

(57) ABSTRACT

An interconnection structure suitable for use as an IC package, probe head or other electrical termination of high density where uninterrupted controlled impedance is desired is described.

25 Claims, 8 Drawing Sheets

CONTROLLED IMPEDANCE STRUCTURES FOR HIGH DENSITY INTERCONNECTIONS

RELATED APPLICATIONS

This Application claims benefit of U.S. Provisional Application No. 60/018,495 by Fjelstad et al., filed Jan. 2, 2007, which is herein incorporated by reference in its entirety.

FIELD OF THE INVENTION

The present invention relates to the field of high density interconnections such as is required for IC packaging and electronic probing systems.

BACKGROUND

High speed electronic signals circuits place significant demands on the circuits and interconnections employed in their point-to-point transmission. This is becoming increasingly important as signal speeds enter the multi-gigahertz range. The challenge begins at the chip and from there the problems cascade through the entire electronic interconnection chain. Ultimately the transmission of electronic signals through signal paths of uniform impedance is critical to the performance of advanced systems. This being so, interconnecting devices and structures that provide such capability are vitally important to the production of viable electronic products. Unfortunately, properly controlling the characteristic impedance, while changing the feature sizes and spacing of the conductors and changing location to redistribute signals exiting the chip, is extremely challenging using current design practices.

Typically, traditional interconnection schemes, beginning at the chip, create small discontinuities at each interconnection transition. For example, while the chip design provides for internal control of the myriad of signal generating circuits within it, the next level interconnections, such as the wire bonds used to interconnect the chip to the package, typically begin the signal degradation process by creating both a small amount capacitance at the point of interconnection and excessive inductance which can cause cross talk. The length of the wire bond, at which point the concerns of inductance becomes critical, is determined by the frequency of the signals being transmitted. As signal speeds rise, the acceptable lead length must be shorter so as not to interfere with the signal. Further down the interconnection pathway, the circuit paths within the package may also contribute to the degradation as those signals are redistributed to make their escape from the package. From there, interconnections to the printed circuit board or next level interconnection devices may include sockets, connectors and other circuit boards. With signal integrity a key objective at high speed, any disruption of the signal in transmission goes counter to that objective and can result in signal degradation, loss and reflections. While a number of solutions are available for low pin counts ICs, owing to the short electrical path and the degrees of freedom associated with such low pin counts, as the pin counts rise, the number of solutions drops off rapidly.

Overcoming the problem for higher pin count applications in a cost effect way is an area of need for innovative solutions. More specifically, there is need for IC packaging and probe head solutions which provide an uninterrupted, controlled impedance path from the terminations on the IC die to the terminations either on a package or to a probe card which will serve to interconnect to the next level interconnection substrate or electrical test system.

Thus it is desirable to have an interconnecting structure that provides a substantially seamless transition from one signal pitch to another without disturbing signal quality. Structures and methods for accomplishing these objectives and other objectives are disclosed herein.

BRIEF DESCRIPTION OF THE DRAWINGS

The present invention is illustrated by way of example, and not by way of limitation, in the figures of the accompanying drawings and in which like reference numerals refer to similar elements and in which:

FIG. 13-B depicts a side elevation view of the controlled impedance high density interconnection structure of FIG. 13A.

FIG. 13-C depicts a bottom view of the controlled impedance high density interconnection structure of FIG. 13A.

DETAILED DESCRIPTION

In the following description and in the accompanying drawings, specific terminology and drawing symbols are set forth to provide a thorough understanding of the present invention. In some instances, the terminology and symbols may imply specific details that are not required to practice the invention. For example, when referring to electrically continuous metal layers, they need not be physically continuous, but can have patterned or random openings to create a more flexible structure while maintaining overall electrical continuity. In the following description, the term microstrip construction is used to describe circuits which exhibit controlled electrical impedance performance. Other controlled impedance structures such as stripline or embedded coax are also anticipated. While the circuit patterns illustrated are generally shown as single signal traces, differential signal traces are anticipated and allowed.

Figure 1:
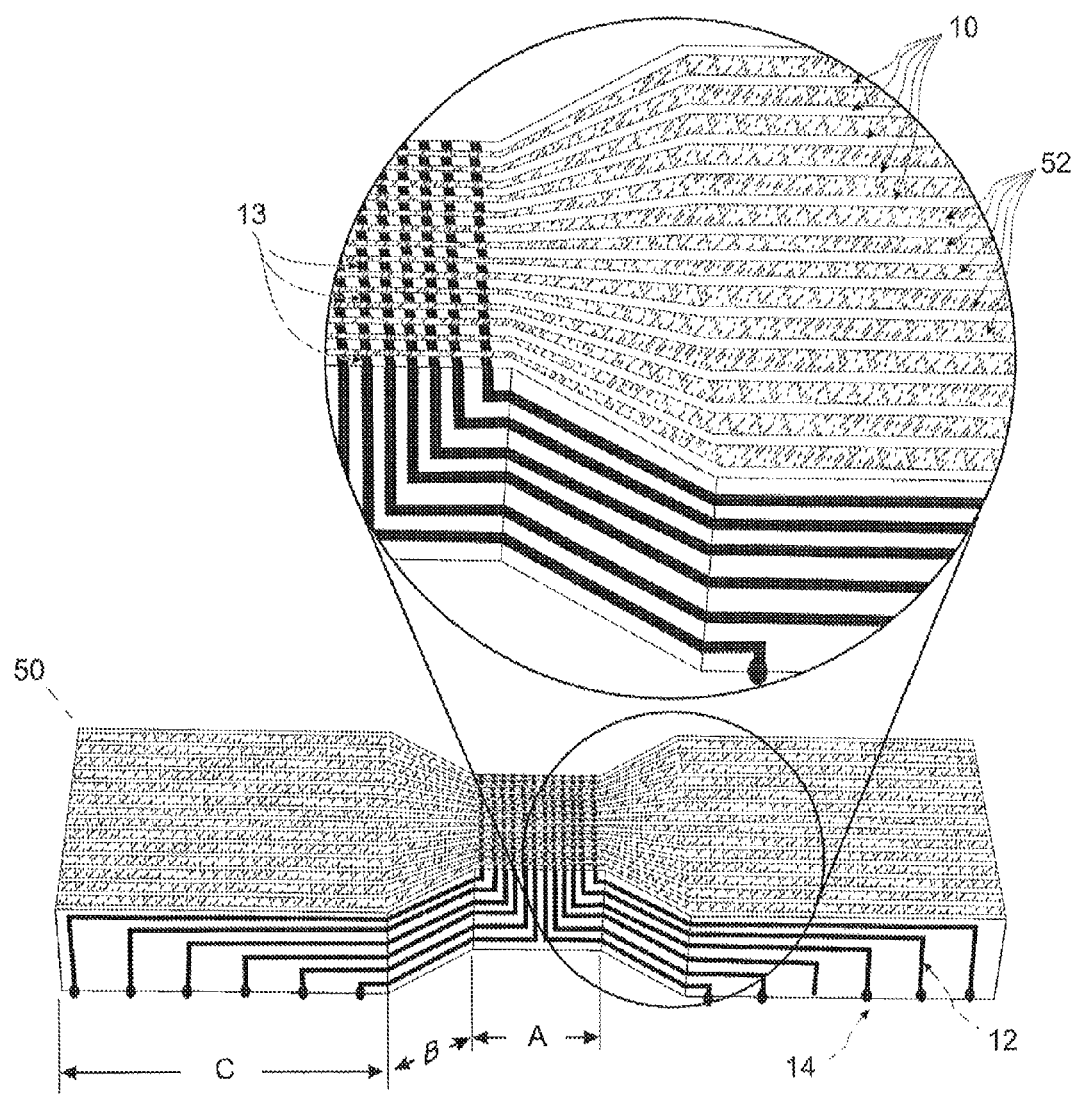
FIG. 1 depicts perspective and enlarged views of a controlled impedance high density interconnection structure comprising multiple circuit layers.
Figure 8:
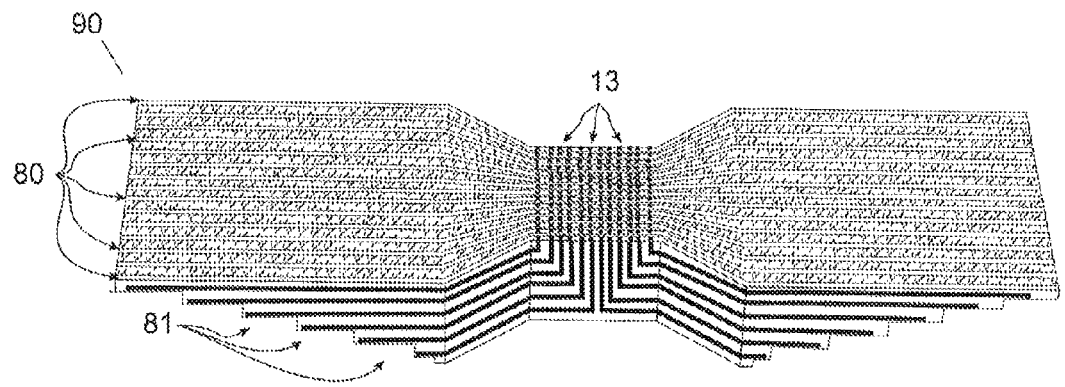
FIG. 8 depicts a perspective view of an alternative embodiment of a controlled impedance high density interconnection structure similar to the one depicted in FIG. 1 comprising a formable or flexible microstrip circuit having coarse-pitch terminals arranged in stair step formation.
Figure 13:
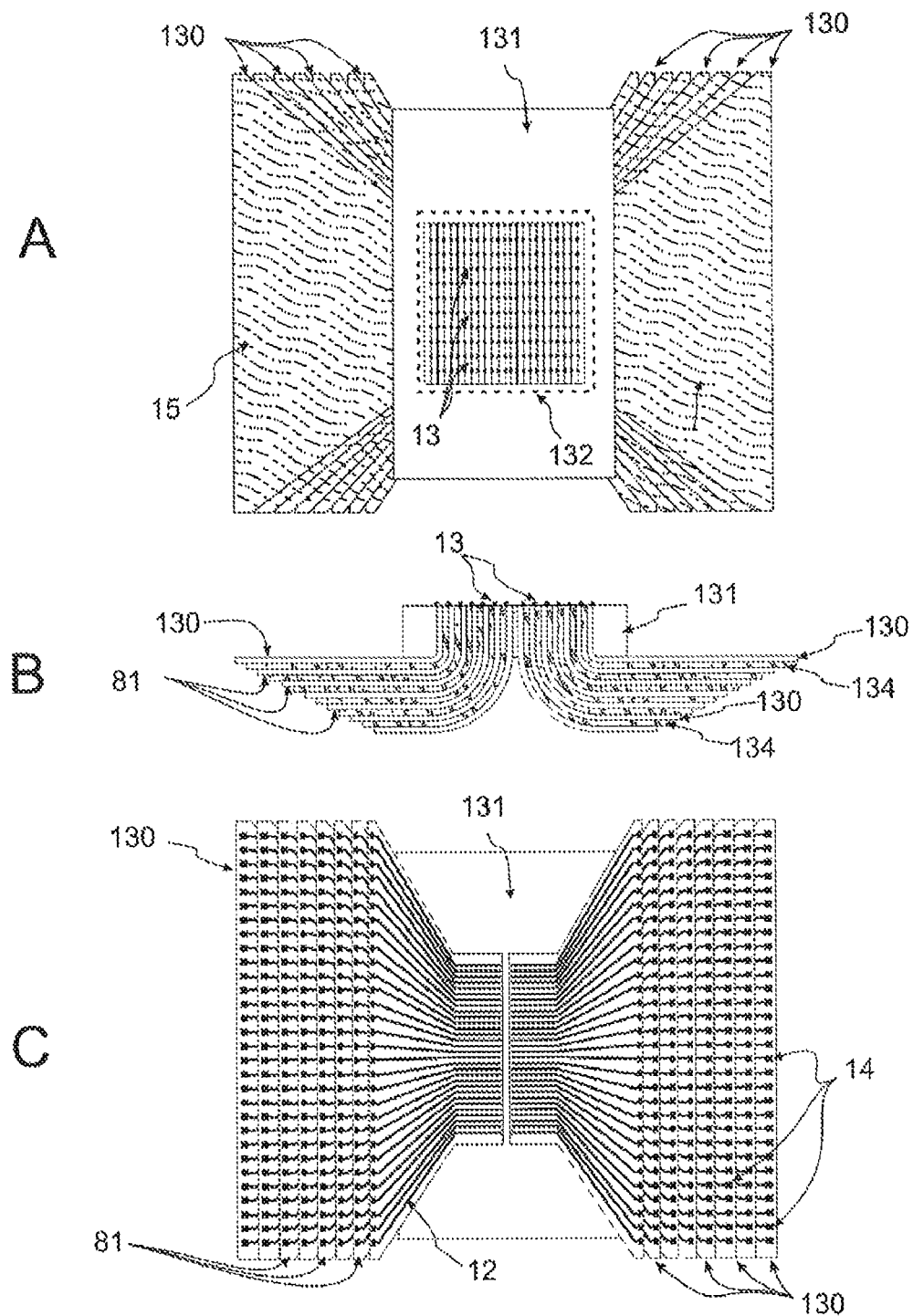
FIG. 13-A depicts a top plan view of an embodiment of a controlled impedance high density interconnection structure having stair stepped interconnections comprised of multiple formable or flexible microstrip circuits.

FIGS. 1, 8, 13-A, 13-B, 13-C, 14 and 15 depict various embodiments of controlled impedance high-density interconnection structures. Each of the controlled impedance high-density interconnection structures described or depicted herein comprises a plurality of circuit layers. Specific elements of a circuit layer may be discussed in conjunction with a single Figure or embodiment. Limiting such discussions to a single Figure is not intended to preclude such elements from the alternative Figures and embodiments. Rather, descriptions of this nature are intended for brevity. The reader will therefore appreciate that, unless a circuit feature or element is incompatible with some particular embodiment, elements described in conjunction with one Figure or embodiment may be utilized in conjunction with the other Figures or embodiments described herein.

Each circuit layer includes conductive circuit paths 12 terminating at a first end in the form of a fine-pitch terminal 13 and terminating at a second end in the form of a coarse-pitch terminal 14. The fine-pitch terminals 13 are grouped in one or more fine-pitch terminal arrays distributed on one or more surfaces of the controlled impedance high-density interconnection structure. The coarse-pitch terminals of a controlled impedance high-density interconnection structure are grouped in one or more coarse-pitch terminal arrays distributed on one or more surfaces of the controlled impedance high-density interconnection structure. One of the distinguishing features between different embodiments described herein is the location and number of coarse-pitch terminal arrays, the number and location of fine-pitch terminal arrays distributed over the surfaces of the controlled impedance high-density interconnection structure.

Controlled impedance high-density interconnect structures described herein can be used, inter alia, as probe heads for electrical testing apparatuses that must couple with a fine-pitch array of electrical terminals, such as might be found on an IC package, or on an IC die.

FIG. 1 depicts a perspective and an enlarged view of a controlled impedance high-density interconnection structure 50, comprising of a plurality of flexible microstrip circuit layers 10, the composition and structure of which are depicted in greater detail in FIGS. 2-7. Multiple circuit layers 10 are arranged in adjacent layers and joined or bonded together using interspersed layers of a suitable adhesive 52. Each flexible microstrip circuit layer 10 comprises a flexible insulating base layer 11 with first and second surfaces, and a plurality of conductive circuit paths 12 formed along one of the surfaces, or disposed within the flexible insulating base material between the first and second surfaces. Throughout this disclosure, specific reference to a circuit path being on a surface, or between first and second surfaces of a flexible insulating base layer are intended only for example, and is not intended to limit the scope of the appended claims. Alternative embodiments are envisioned, including flexible strip embodiments in which a circuit path is insulated from inadvertent contact on all sides, and flexible strips in which a circuit path rests on the surface.

Within the embodiment of FIG. 1, the fine-pitch terminals are grouped in a single fine-pitch terminal array in the region identified by reference element (A), which is centrally located on the upper surface of the interconnection structure 50. The coarse-pitch terminals are grouped among two different coarse-pitch terminal arrays located on the left and right hand sides of the bottom surface of the interconnection structure. The coarse-pitch terminal array on the left is identified by reference element (C), and the coarse-pitch terminal array on the right hand side is plainly visible, but not identified by a reference element.

The circuit layers are bonded by the suitable adhesive 52 to yield closely spaced lateral pitch between terminals 13, conforming to the spacing of in IC package or IC die to which the fine-pitch terminals 13 are applied. Accurate spatial arrangement of the terminals 13, 14 during the bonding of circuit layers 10 may be achieved through the use of a fixture, or jig. The circuit layers 10 fan-out in dispersion areas such as area (B) of FIG. 1. The "fanning" or "dispersion" can be achieved by a progressively increasing thickness of the adhesive layer 52 in the dispersion area (B). Alternatively, embodiments are envisioned in which the flexible layers containing the circuit paths have an increasing thickness, and the adhesive layer is of constant thickness. The thickness increases along a line or plane of the dispersion area, extending between a fine-pitch terminal array, such as area (A) of FIG. 1 to a coarse-pitch array such as area (C) of FIG. 1.

Throughout this disclosure, the various embodiments depict the thickness of the respective adhesive layers within a fine-pitch terminal array as being constant thickness, producing parallel layers. Similarly, the various embodiments depicted herein disclose parallel layers in each of the coarse-pitch terminal arrays, which would also require a fixed adhesive layer thickness in each of these terminal arrays. However, those skilled in the art will readily appreciate that, in any embodiment, the thickness of the adhesive layer, or any other physical member controlling the tangent spacing between circuit layers, is selected to conform to the spacing of terminals on a test instrument or next-level connective member. Such spacing may therefore conform to parallel, oblique, or even curved spacing of layers. Accordingly, figures depicting parallel spaced layers within a coarse-pitch terminal array or a fine-pitch terminal array is offered for illustrative purposes only, and are not intended to limit alternative embodiments envisioned within the spirit and scope of the appended claims.

Figure 2:
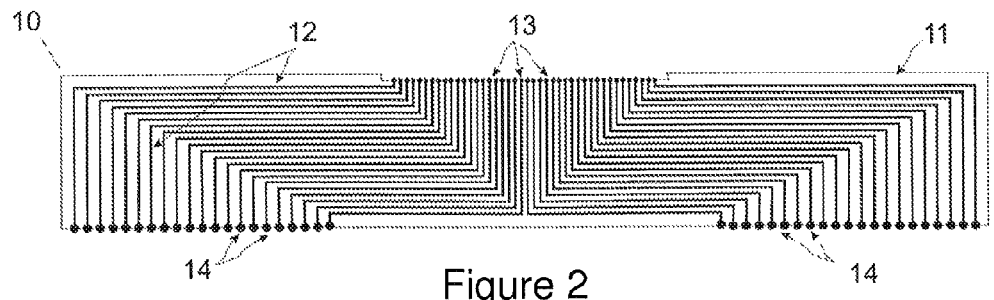
FIG. 2 depicts a side elevation view of a circuit layer from the interconnection structure of FIG. 1 comprising a formable or flexible microstrip circuit.

FIG. 2 provides a side elevation view of an embodiment of an individual circuit layer 10 within the controlled impedance high-density interconnection structure 50 depicted in FIG. 1. A circuit layer includes a formable or flexible insulating base layer 11 of defined thickness and dielectric properties, and a pattern of conductive circuit paths 12 arranged on the front surface, or between the front and rear surfaces of the insulating base layer 11. (As used herein, the terms "front" and "rear" are used relative to the a particular figure, and are not intended to limit the applications of the embodiments described in the appended claims). The conductive circuit paths 12 on the near surface of the insulating base material terminate in fine-pitch terminals 13 disposed along the top edge of the circuit layer 10, and spaced in a manner corresponding to the contact spacing of a high terminal-density device, such as an IC die, IC package, or test instrument. In an embodiment, the horizontal spacing of fine-pitch terminals 13 within a given circuit layer 10 is equal to the spacing of fine-pitch terminals in adjacent layers 10 of the same controlled impedance high density interconnection structure 50 of FIG. 1. However, the horizontal spacing within a circuit layer may be greater than, or less than the spacing of adjacent layers in the fine-pitch area (A) of an interconnection structure.

Each conductive circuit path 12 of FIG. 1 also terminates at a respective second terminal 14 located in one of two coarse pitch terminal arrays (C) of FIG. 1. In alternative embodiments, a controlled impedance high-density interconnection structure may have more or fewer coarse-pitch terminal arrays than depicted in FIG. 1, and may have more than the single fine-pitch terminal array (A) depicted in FIG. 1. In yet another embodiment, the separation of the fine-pitch and coarse pitch terminals can be substantially equal.

The formable or flexible insulating base material 13 may be of any material suitable to the application. For example, unreinforced polyimide film common to flexible circuit manufacture may be used. Alternative flexible films such as polyetherimide, polyethylene napthalate, polyester or a liquid crystal polymer may be used. The circuits are designed to provide a pre-selected characteristic impedance (e.g. 50 Ohms).

Figure 3:
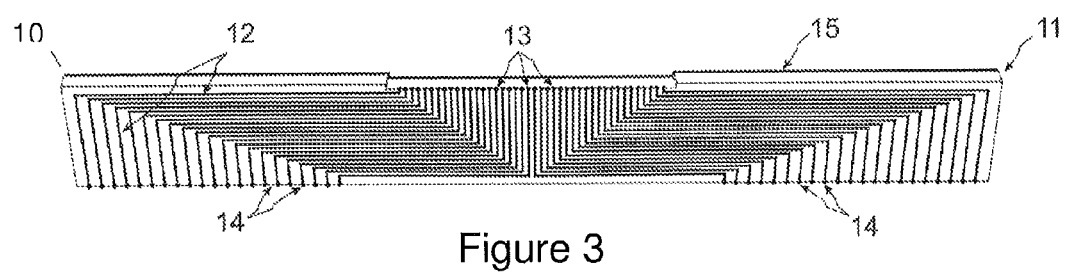
FIG. 3 depicts a perspective view of the circuit layer of FIG. 2.

FIG. 3 depicts a perspective view of an embodiment of the circuit layer 10 of FIG. 2, revealing a contiguous reference metal layer 15 on the rear surface of the insulating base material (from the perspective of FIG. 3). The flexible insulating base layer 11 is preferably of uniform thickness, so that the tangent distance from the metal layer 15 to each conductive circuit paths 12 remains constant, thereby maintaining a constant impedance through the length of each conductive circuit path.

Figure 4:
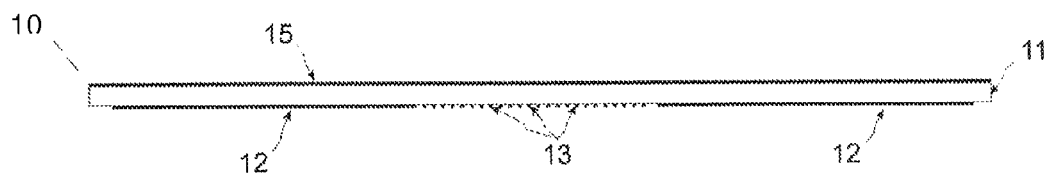
FIG. 4 depicts a top plan (edge view) of a circuit layer of FIG. 2, showing a contiguous and electrically continuous metal layer on the far surface (second side) of the flexible insulating layer.

FIG. 4 discloses a top plan view (an edge view) of a circuit layer 10 of FIG. 3, further depicting the electrically continuous metal layer 15 disposed along the rear surface of the insulating base material 11 of the circuit layer 10. Referring to FIGS. 2 and 3, it will be appreciated that the fine-pitch terminals 13 are visible from a top plan view, whereas the coarse pitch terminals are not.

Figure 5:
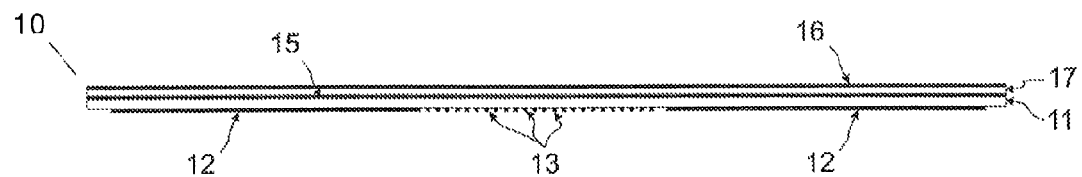
FIG. 5 depicts a top plan (edge view) of an alternative embodiment of the circuit layer of FIG. 2, including first and second contiguous and electrically continuous metal layers forming a capacitive structure acting on the circuit layer.

FIG. 5 depicts a top plan view (an edge view) of an alternative embodiment of the circuit layer of FIG. 2, including a flexible insulating layer 11 with conductive circuit paths 12 disposed on the front surface of the insulating layer, a first contiguous and electrically continuous metal layer 15 disposed on the rear surface of the flexible insulating layer 11, a second electrically continuous metal layer 16 parallel to the first electrically continuous metal layer 15 and a second formable or flexible insulating layer 17 separating the two contiguous metal layers 15, 16. The parallel metal layers 15, 16 separated by the second insulating layer 17 effectively creates a capacitor. The formable or flexible material layer 17 may have a higher dielectric constant than the first dielectric layer 11 and may be made very thin to increase capacitance. This capacitor structure may have significant benefit for semiconductor power supply decoupling since this capacitive structure has little inductance thereby reducing L di/dt voltages. Alternatively, the second contiguous metal layer 16 and second formable or flexible material layer 17 may be constructed with embedded discrete components, such as capacitors, inductors, ESD protection devices or active components which become available for connection to the circuit traces of the conductive circuit paths 12.

Figure 6:
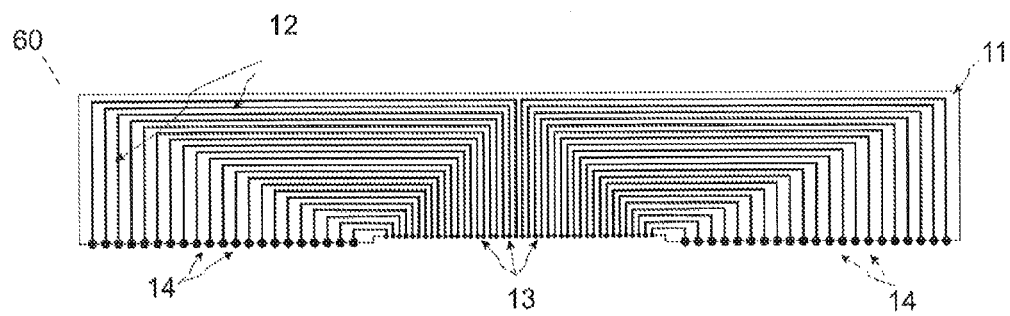
FIG. 6 depicts a side elevation view of another embodiment of a circuit layer in which the fine-pitch terminals and the coarse-pitch terminals are oriented along the same (bottom) edge.

FIG. 6 depicts a side elevation view of an alternative circuit layer 60 embodiment. The numbered elements of circuit layer 60 have been described in conjunction with FIGS. 2-5, including material construction and optional metal and capacitive layers. The circuit layer 60 embodied in FIG. 6 distinguishes over the embodiments associated with FIGS. 1-5 in grouping of the fine-pitch terminals 13 and coarse pitch terminals 14. Within FIG. 6, the fine-pitch and coarse-pitch terminals are arranged along the same edge of circuit layer 60, with the fine-pitch terminals grouped in a single center array, and the coarse pitch terminals arranged in first and second arrays on opposite sides of the fine-pitch terminal array. Alternative embodiments of the circuit layer of FIG. 6 may include a single ground layer, such as depicted in FIGS. 3 and 4, or a capacitive layer shown in FIG. 5, comprising dual metal layers separated by a dielectric layer.

Figure 7:
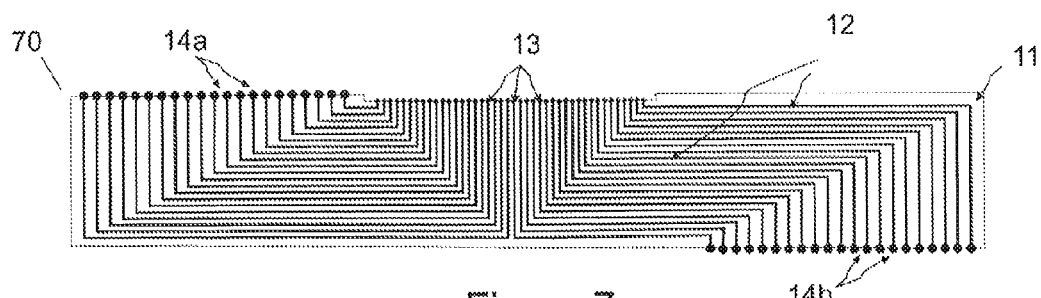
FIG. 7 depicts a side elevation view of another embodiment of a circuit layer in which the fine-pitch terminals and some of the coarse-pitch terminals are oriented along the top edge, and wherein some of the coarse-pitch terminals are oriented along the bottom edge.

FIG. 7 depicts a side elevational view of an alternative embodiment of a circuit layer 70. The numbered elements of circuit layer 70 have been described in conjunction with FIGS. 2-5, including material construction and optional metal and capacitive layers. The circuit layer 70 embodied in FIG. 7 distinguishes over the embodiments associated with FIGS. 1-5 in the grouping of the fine-pitch terminals 13 and coarse pitch terminals 14. Within FIG. 7, a single fine-pitch terminal array is disposed along the top edge of the circuit layer 70, in the horizontal center of the figure. A first coarse-pitch terminal array is disposed on the left hand side of the upper edge of the circuit layer 70, and a second coarse-pitch terminal array is disposed along the right hand side of the bottom edge of the circuit layer 70. Alternative embodiments of the circuit layer of FIG. 7 may include a single ground layer, such as depicted in FIGS. 3 and 4, or a capacitive layer shown in FIG. 5, comprising dual metal layers separated by a dielectric layer.

FIG. 8 depicts a perspective view of an embodiment of a controlled impedance high-density interconnect structure 90. The fine-pitch terminals 13 are distributed within a single fine-pitch terminal array formed along the top row of the circuit layer. The coarse-pitch terminals are distributed among two mirror image stair step regions formed on the left hand and right hand side of the circuit layer, each region forming a stair step structure along the bottom of the controlled impedance high-density interconnect structure 90. Within FIG. 8, an individual stair step 81 does not correspond to a respective circuit layer 80. Rather, a single stair step crosses multiple circuit layers 80. Accordingly, as will be further appreciated from FIG. 9, each circuit layer 80 comprises a plurality of stair step.

Figure 9:
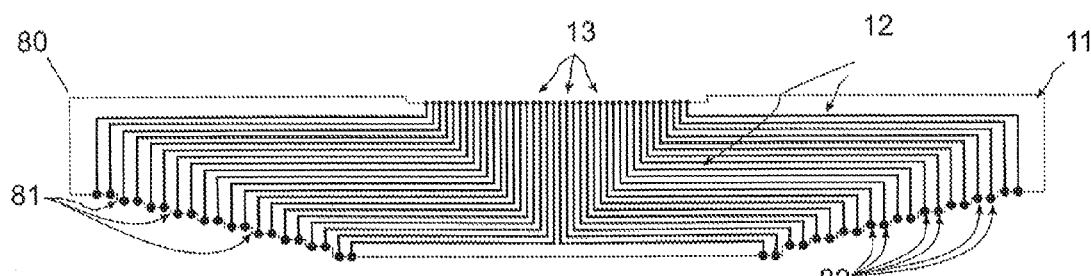
FIG. 9 depicts a side elevation view of an individual circuit layer of the stair-step embodiment of the controlled impedance high density interconnection structure of FIG. 8, depicting stair step formations within an individual flexible circuit layer.

FIG. 9 depicts a side elevational view of a circuit layer 80 of the controlled impedance high-density interconnect structure 90 of FIG. 8. The fine-pitch terminals 13, conductive circuit paths 12, and flexible insulating layer 11 have been described in conjunction with FIGS. 2-5. Embodiments of the circuit layer 80 of FIG. 9 can include the optional metal and capacitive layers also discussed in conjunction with FIGS. 2-5. The fine-pitch terminals 13 are distributed within a single fine-pitch terminal array formed along the top row of the circuit layer. The coarse-pitch terminals are distributed among two mirror image stair step regions formed on the left hand and right hand side of the circuit layer, each region forming a stair step structure along the bottom of the circuit layer 80. In an embodiment, each stair step comprises two coarse pitch terminals.

Figure 10:
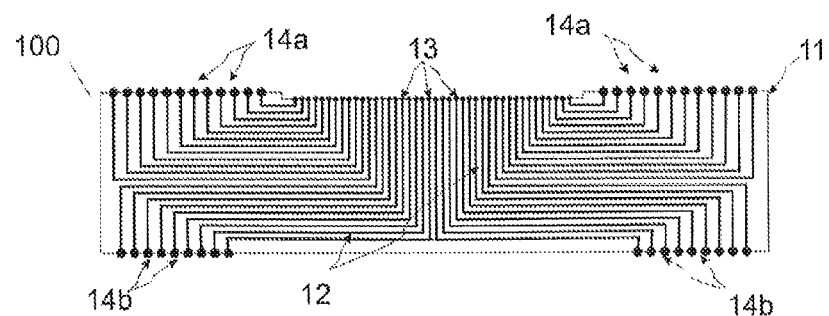
FIG. 10 depicts a side elevation view of another embodiment of a circuit layer used in construction of a controlled impedance high density interconnection structure such as depicted in FIGS. 1 and 8, wherein fine-pitch terminals are grouped in a central area along the top edge, and coarse-pitch terminals are arranged in four separate groups, including two groups on the upper edge, and two groups on the lower edge.

FIG. 10 depicts a side elevational view of an embodiment of a circuit layer 100 that can be used to in a controlled impedance high-density interconnect structure. The fine-pitch terminals 13, conductive circuit paths 12, and flexible insulating layer 11 have been described in conjunction with FIGS. 2-5. Embodiments of the circuit layer 100 of FIG. 10 can include the optional metal and capacitive layers also discussed in conjunction with FIGS. 2-5. Each of the conductive circuit paths 12 terminates at a first end in a fine-pitch terminal 13 which are grouped in a single fine-pitch terminal array. The fine-pitch terminal array, can correspond to contacts used for interconnecting to an IC or probing a dense electronic device on a first edge of the circuit element. Each of the controlled impedance conductive circuit paths 12 also has a coarse-pitch terminals 14. The coarse-pitch terminals are distributed among four distinct coarse-pitch terminal arrays distal from the fine-pitch terminal array. The coarse-pitch terminal arrays are segregated by the needs of the design to terminate at more than one edge. For example, terminations 14a are located on the same edge as the fine-pitch terminations 13 while terminations 14b are located on a second edge away from the fine-pitch terminations 13.

Figure 11:
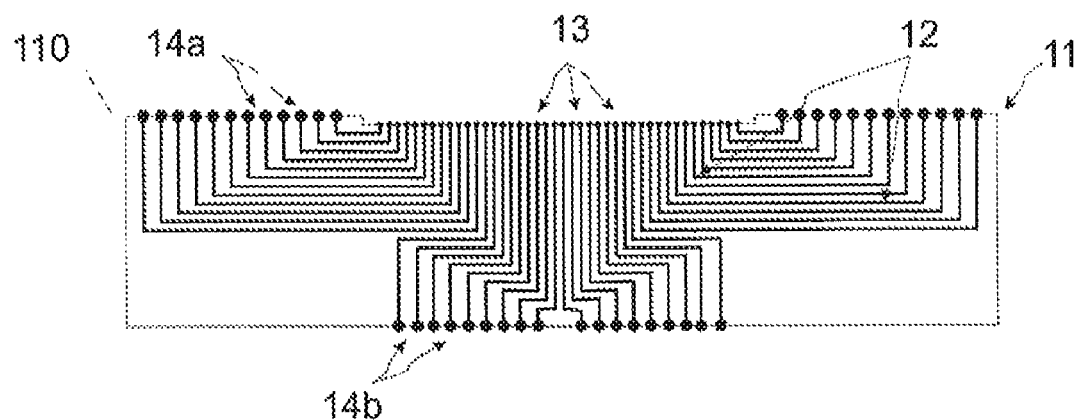
FIG. 11 depicts a side elevation view of an alternative embodiment of a circuit layer used in construction of a controlled impedance high density interconnection structure such as depicted in FIGS. 1 and 8.

FIG. 11 depicts a cross section (side elevational) view of an embodiment of a circuit layer 110 suitable for use in a controlled impedance high-density interconnect structure generally described herein. A controlled impedance high-density interconnect structure formed a plurality of circuit layers 110 can be used in construction of an IC package or probe. As described generally herein, the circuit layer 110 is substantially a formable or flexible microstrip circuit comprised of a formable or flexible insulating base material 11 of defined thickness and dielectric properties and a pattern of controlled impedance conductors 12 on one side. As discussed in conjunction with FIGS. 2-5, alternative embodiments may include an electrically continuous reference (e.g. ground layer) conductive surface on the side opposite the pattern of conductors (not visible), or a capacitive layer formed by a dielectric layer disposed between adjacent metal layers. Each of the conductive circuit paths 12 terminates at a first end in a fine-pitch terminal 13 corresponding to contacts used for interconnecting to an IC or probing a dense electronic device on a first edge of the circuit element. Each of the conductive circuit paths 12 has a second (coarse-pitch) terminal distal from the fine-pitch terminal. The fine-pitch terminals 13 are segregated into a single fine-pitch terminal array formed in the central region of the top edge of the circuit layer, and the coarse-pitch terminals 14 are segregated into multiple coarse-pitch terminal arrays according to the needs of the design to terminate at more than one edge. For example, terminations 14a are located on the same edge as the fine-pitch terminations 13 and distributed on the left and right hand sides of the fine-pitch terminals while terminations 14b are located on a second (lower) edge and directly opposite the fine-pitch terminations 13.

Figure 12:
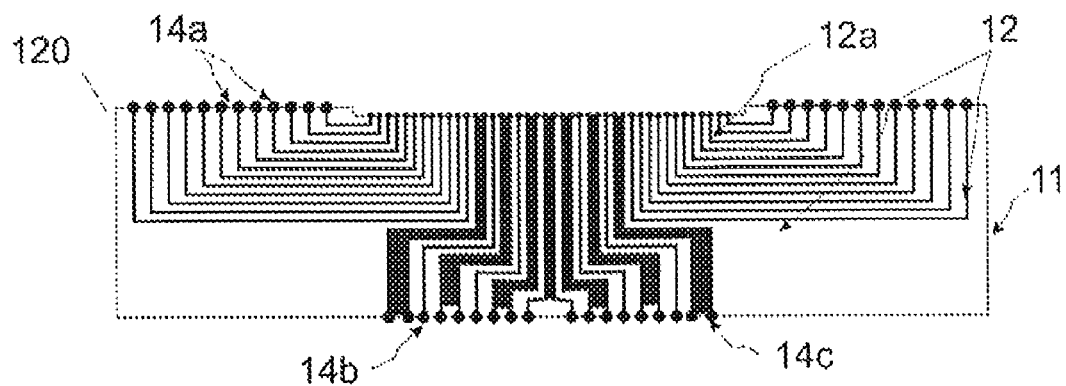
FIG. 12 depicts a side elevation view of an alternative embodiment of a controlled impedance high density interconnection structure such as depicted in FIGS. 1 and 8.

FIG. 12 depicts a cross sectional (side elevational) view of an embodiment of a circuit layer 120 suitable for use in a controlled impedance high-density interconnect structure generally described herein. A controlled impedance high-density interconnect structure formed a plurality of circuit layers 120 can be used in construction of an IC package or probe. As described generally herein, the circuit layer 120 is substantially a formable or flexible microstrip circuit comprised of a formable or flexible insulating base material 11 of defined thickness and dielectric properties and a pattern of conductors 12 on one side. As discussed in conjunction with FIGS. 2-5, alternative embodiments may include an electrically continuous reference (e.g. ground layer) conductive surface on the side opposite the pattern of conductors (not visible), or a capacitive layer formed by a dielectric layer disposed between adjacent metal layers. Each of the conductive circuit paths 12, terminate at a first end in a fine-pitch terminal 13 corresponding to contacts used for interconnecting to an IC or probing a dense electronic device on a first edge of the circuit element. The conductive circuit paths 12 are depicted by both wide and thin lines. The wider conducive circuit paths might be used for power transmission or other noise tolerant signals. The controlled impedance conductors 12a have second (coarse pitch) terminations 14a on the same edge, but geometrically isolated distal from the fine-pitch end 13 of the conductive circuit paths, as might be dictated by the design needs while terminations 14b for fine circuits and co-joined terminations 14c for courser circuits are located on a second edge away and directly opposite the fine-pitch terminations 13.

FIGS. 13A-13C depict top, side and bottom views of another embodiment of a controlled impedance high-density interconnection structure having stair stepped interconnections comprised of multiple formable or flexible microstrip circuits. Top and bottom are arbitrary terms and are used only to distinguish the drawings for discussion. In the top view shown FIG. 13A, are two groups (e.g., left and right as viewed in the figure) of substantially controlled impedance formable or flexible circuit layers 130. Each circuit layer is comprised of conductive circuit paths as described above, and a substantially continuous metal layer 15. Many specific elements and features of the composition and function of the elements depicted in FIGS. 13A-13C, such as conductive circuit paths 12, have been described above in conjunction with FIGS. 1-5. The circuit layers are aligned and bonded together at a common edge within a suitable bonding or encapsulating material 131 to create an area 132 of fine-pitch contacts 13 such as might be used for interconnecting to a chip or for making a high density probe.

FIG. 13B depicts a side elevation view of the controlled impedance high-density interconnection structure of FIG. 13a. Each circuit layer 130 has a plurality of conductive circuit paths 12 which terminate at top surface fine-pitch terminations 13 suitable for interconnecting to an IC or providing a probe head. The circuit layers 130 are bent or preformed to shape and layered and joined with a bonding material or adhesive layer 134 between circuit layers. The length of adjacent circuit layers 130 are configured to create stair steps 81 on which coarse-pitch terminals 14 can be accessed for electrical interconnection. To avoid congestion in interpreting the elements of FIG. 13B, the metal layer 15 has not been depicted within the figure. From the various views 13A-13C, however, it can be readily appreciated that multiple metal layers 15, such as the one depicted in FIG. 13A, could be individually disposed between adjacent circuit layers 130, creating an interspersed sequence of metal layers 15 and circuit layers 130. It will further be appreciated that, in embodiments incorporating interspersed metal layers, the signal traces 12 may be embedded in the flexible microstrip insulator, and not exposed on either surface, thereby preventing electrical shorting against the metal layer.

FIG. 13C depicts a bottom view of the controlled impedance high-density interconnection structure of FIG. 13A. The circuit layers 130 are overlaid on each other, and the distal ends 81 of each of the circuit layers 130 are arranged in stair stepped orientation. According to the embodiment of FIG. 13, the circuit paths 12 provide substantially controlled impedance for a variety of applications, including, but not limited to, probe heads for electrical test instruments that are required to interface with fine pitch terminations.

Figure 14:
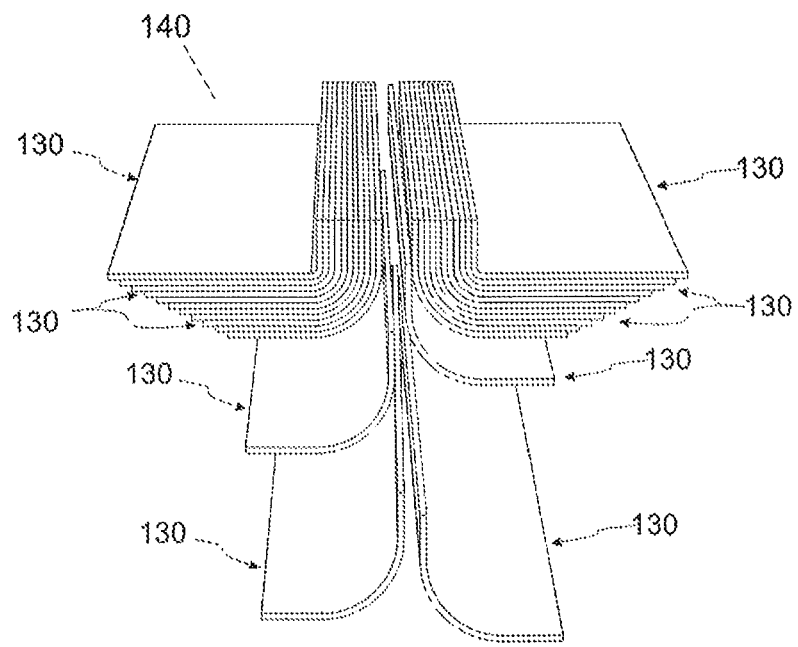
FIG. 14 depicts a perspective view of a partially assembled embodiment of the controlled impedance high density interconnection structure of FIG. 13A, depicting an exploded view comprised of multiple formable or flexible microstrip circuit layers.

FIG. 14 depicts a partially-exploded perspective view of the controlled impedance high-density interconnection structure of FIGS. 13-A and 13-B illustrating how the circuit layers 130 can be prefabricated and pre-formed to shape to allow them to accurately nest one to another and may be preformed in a range of pitches and lengths to allow the user to create a structure that can be mechanically fastened together in a manner that allows for the parts to be disassembled and separated after use, then reconfigured and reused for a new application if desired.

Figure 15:
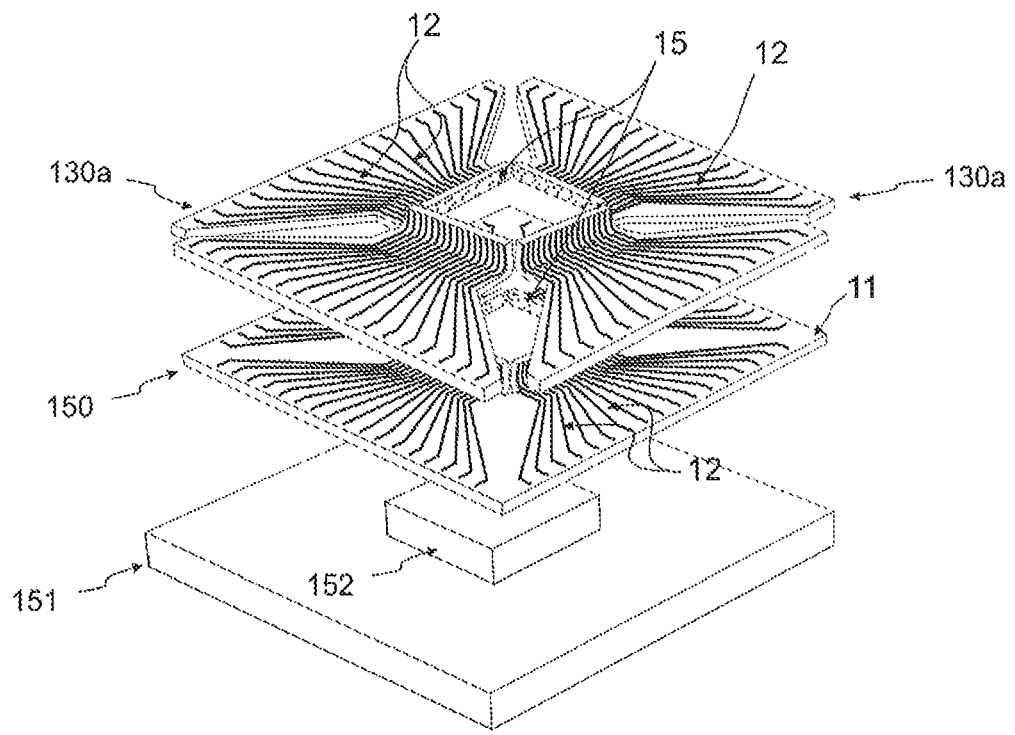
FIG. 15 depicts an exploded perspective view of an alternative embodiment of a controlled impedance high density interconnection structure suitable for use with peripheral contacts.

FIG. 15 depicts an exploded view of an embodiment of a controlled impedance high-density interconnection structure suited for use with and interconnection to devices having a linear array of peripheral contacts, in contrast to the foregoing figures, which depicted interconnection devices having both fine-pitch and coarse-pitch contacts arranged in two-dimensional block-arrays FIG. 15 depicts an exploded view of three different circuit layers, 151, 150 and 130a. The lower circuit layer 151 has a horizontal planar section extending vertically upward to form a pedestal 152. The middle circuit layer 150 includes a flexible or formable dielectric base layer 11 comprising a horizontal planar region extending to a central aperture. The central aperture of the middle circuit layer 150 is configured to accommodate the insertion of the pedestal of the lower layer when the layers are assembled into a unit. The dielectric layer 11 of the central circuit layer 150 curves upward at the aperture, forming a neck. The dielectric layer 11 of the top circuit layer 130a also curves upward at the central aperture to form a neck. Because the top layer 130a is formed from four separate pieces, these four pieces converge around the neck of the middle layer 150. The aperture of the top layer 130a is therefore not a preset size, but is determined during assembly as the pieces are formed around the neck of the middle layer. Conductive circuit paths 12 extend from the peripheral edge(s) of the each of the one or more dielectric members 11 depicting a horizontal orientation that, proximate the aperture, curves upward to form a substantially vertical neck 1. A conductive ground layer 15 is disposed on the lower surface of circuit layer each formable dielectric base layer, and conductive circuit paths 12 are disposed on the upper surface of each formable dielectric layer 11. The conductive circuit paths 12 are disposed on the upper surface of the formable dielectric layers, and extend from a central-aperture (where they are oriented vertically along the upturned section of the formable dielectric base layer 11), to the coarse-pitch terminals that are arranged along the distal edge(s) of the formable dielectric layers 11, when assembled will provide substantially planar contacts. The circuits can be applied to a base 151 with a central pedestal 152 made of a suitable material. The base can be a metal and insulator or a combination depending on the design requirements. Finally, a collar (not shown) can be provided to help collect, hold in place and align the contact ends.

Figure 16:
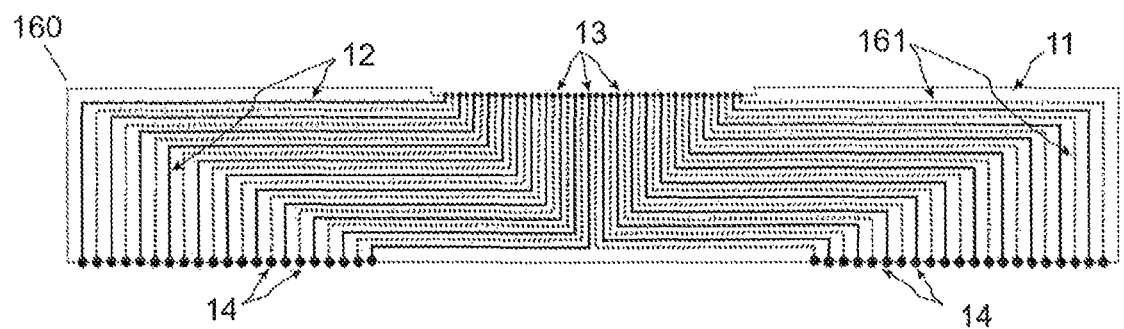
FIG. 16 depicts a side elevation view of an embodiment of a formable or flexible circuit layer having circuit elements on both sides of the insulating substrate.

FIG. 16 provides a side elevation view of an embodiment of a circuit element 160 comprising a formable or flexible circuit having circuits on both sides of the insulating substrate 11. In the figure circuits on the near side are shown as solid line 12 and circuits on the far side are shown as phantom lines 161. The circuit lines on one side may be all signals and the circuits on the opposing side may be all grounds or vice versa. When staggered layer circuits are assembled, the layers can create a structure where every signal is surrounded by grounds circuits to reduce cross talk. In addition depending on the design needs mixtures of ground, power and signal circuit are possible.

Although the invention has been described with reference to specific exemplary embodiments thereof, it will be evident that various modifications and changes may be made thereto without departing from the broader spirit and scope of the invention as set forth in the appended claims. For example, terminations can be provided for on both sides of the circuit elements with ground, power and circuit elements intermixed on each side of the circuit elements and ground layers may be hatched or filigreed in a suitable manner to decrease metal content thus maintaining electrical continuity while increasing flexibility or formability. Moreover, the circuit elements can be provided with other features such as a means of controlling occurrences of electrostatic discharge (ESD) to protect the chip in the package or the device being tested if used as a probe head. The specification and drawings are, accordingly, to be regarded in an illustrative rather than a restrictive sense.

We claim:

1. An interconnection device comprising:
   first and second circuit layers, each circuit layer comprising a plurality of conductive circuit paths coupled with a formable insulating layer having a uniform thickness and having first and second surfaces, each conductive circuit path terminating in a fine-pitch terminal at a proximal end and a coarse-pitch terminal at a distal end, wherein each fine-pitch terminal is disposed in a fine-pitch terminal array comprising a plurality of fine-pitch terminals, and each coarse-pitch terminal is disposed in a coarse-pitch terminal array comprising a plurality of coarse-pitch terminals,
   wherein the first circuit layer further comprises a first contiguous metal layer disposed against the second surface of the formable insulating layer,
   wherein the first contiguous metal layer functions as a ground reference layer, and
   wherein the first circuit layer further comprises a second contiguous metal layer separated from the first contiguous metal layer by a dielectric layer of uniform thickness; and
   a first insulating adhesive layer disposed between the first and second circuit layers, wherein a section of the first insulating adhesive layer has a non-uniform thickness.

2. The interconnection device of claim 1 wherein a thickness of a section of the first insulating adhesive layer increases at a linear rate within the dispersion area when measured along a predetermined straight line.

3. The interconnection device of claim 1 wherein the first insulating adhesive layer has a first uniform thickness throughout an area that includes a fine-pitch terminal array.

4. The interconnection device of claim 3 wherein the first insulating adhesive layer has a second uniform thickness throughout an area that includes a coarse-pitch terminal array.

5. The interconnection device of claim 4 wherein the second uniform thickness is greater than the first uniform thickness.

6. The interconnection device of claim 1 wherein a first coarse-pitch terminal array comprises at least two rows of coarse-pitch terminals and at least two columns of coarse-pitch terminals.

7. The interconnection device of claim 1 wherein a fine-pitch terminal array is disposed on a first side of the interconnection assembly, and a first coarse-pitch terminal array is on a second side of the interconnection assembly.

8. The interconnection device of claim 1 wherein a fine-pitch terminal array is disposed on a first side of the interconnection assembly, and a first coarse-pitch terminal array is also disposed on the first side of the interconnection assembly.

9. The interconnection device of claim 7 further comprising a second coarse-pitch terminal array geometrically segregated from the first coarse-pitch terminal array.

10. The interconnection device of claim 9 wherein the second coarse-pitch terminal array is located on a same side of the interconnection assembly as the first coarse-pitch terminal array.

11. The interconnection device of claim 10 further comprising a third coarse-pitch terminal array disposed on a different side of the interconnection assembly as the first coarse pitch terminal array.

12. The interconnection device of claim 11 further comprising a fourth coarse-pitch terminal array disposed on a same side of the interconnection assembly as the third coarse pitch terminal array.

13. The interconnection device of claim 9 wherein the first and second coarse-pitch terminal arrays are disposed on different sides of the interconnection assembly.

14. The interconnection device of claim 1 wherein a first coarse-pitch terminal array is a stair step array.

15. The interconnection device of claim 1 wherein a first coarse-pitch terminal array is disposed on a flat surface.

16. The interconnection device of claim 1 wherein at least one of the circuit paths has a controlled characteristic impedance.

17. The interconnection device of claim 1, wherein a tangent distance from any of the conductive circuit paths of the first circuit layer to the first contiguous metal layer is a fixed distance.

18. The interconnection device of claim 1 wherein the first and second contiguous metal layers are electrically coupled to different voltage potentials.

19. The interconnection device of claim 1 where the first and second contiguous metal layers and the intervening dielectric layer are configured to create a capacitance layer within at least one formed circuit element of the assembled structure.

20. The interconnection device of claim 1 wherein a spacing of fine-pitch terminals within a fine-pitch terminal array conforms to a terminal pattern on an IC die.

21. The interconnection device assembly of claim 1 wherein a coarse-pitch terminal array substantially depicts a circle.

22. The interconnection device assembly of claim 1 wherein a coarse-pitch terminal array substantially depicts a polygon.

23. The interconnection assembly of claim 1 where interconnection circuits are provided on more than one side of the dielectric base material.

24. The interconnection assembly of claim 1 further comprising at least one protective ESD circuit.

25. The interconnection device assembly of claim 1 wherein the formable insulating layer is flexible.

* * * * *